(12) United States Patent
Grise et al.

(10) Patent No.: US 7,529,294 B2
(45) Date of Patent: May 5, 2009

(54) TESTING OF MULTIPLE ASYNCHRONOUS LOGIC DOMAINS

(75) Inventors: Gary Douglas Grise, Colchester, VT (US); Vikram Iyengar, South Burlington, VT (US); David E. Lackey, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 383 days.

(21) Appl. No.: 11/276,433

(22) Filed: Feb. 28, 2006

(65) Prior Publication Data

US 2007/0204194 A1   Aug. 30, 2007

(51) Int. Cl.
*H04B 3/46* (2006.01)
(52) U.S. Cl. .................. 375/224; 375/228; 375/354; 714/724; 714/725; 714/726; 714/738; 716/4
(58) Field of Classification Search .............. 375/224, 375/228, 354; 714/724, 725, 726, 738; 716/4
See application file for complete search history.

(56) References Cited

U.S. PATENT DOCUMENTS

| | | | | |
|---|---|---|---|---|
| 5,604,432 A | * | 2/1997 | Moore et al. | 324/158.1 |
| 6,173,435 B1 | * | 1/2001 | Dupenloup | 716/18 |
| 6,327,684 B1 | * | 12/2001 | Nadeau-Dostie et al. | 714/731 |
| 6,442,722 B1 | * | 8/2002 | Nadeau-Dostie et al. | 714/731 |
| 6,957,403 B2 | * | 10/2005 | Wang et al. | 716/3 |
| 6,999,542 B1 | * | 2/2006 | Korger et al. | 375/354 |
| 2003/0204802 A1 | | 10/2003 | Sim | |
| 2005/0055614 A1 | | 3/2005 | Yeh | |
| 2005/0055615 A1 | | 3/2005 | Agash et al. | |
| 2005/0155003 A1 | | 7/2005 | Rich et al. | |
| 2005/0166104 A1 | | 7/2005 | Rich et al. | |

* cited by examiner

*Primary Examiner*—Juan A Torres
(74) *Attorney, Agent, or Firm*—Schmeiser, Olsen & Watts; Anthony J. Canale

(57) ABSTRACT

A digital system and a method for operating the same. The digital system includes (a) a first and a second pins, (b) first and second logic domains, and (c) first and second test pulse generator circuits. The first test pulse generator circuit is electrically coupled to the first pin and the first logic domain. The second test pulse generator circuit is electrically coupled to the second pin and the second logic domain. When a first test signal and K (positive integer) common test enable signals being asserted, the first test pulse generator circuit generates two first test pulses resulting in the first logic domain being tested. When a second test signal and the K common test enable signals being asserted, the second test pulse generator circuit generates two second test pulses resulting in the second logic domain being tested. The first and second pins are connected to a tester.

20 Claims, 3 Drawing Sheets

TESTING OF MULTIPLE ASYNCHRONOUS LOGIC DOMAINS

BACKGROUND OF THE INVENTION

1. Technical Field

The present invention relates to testing of multiple asynchronous logic domains, and more specifically, to testing of multiple asynchronous logic domains using the same test pattern.

2. Related Art

In a digital system having multiple asynchronous logic domains, the testing of the multiple asynchronous logic domains has to be performed in a pre-specified order which is hard-wired in the digital system. It is desirable to test the multiple asynchronous logic domains in any desired order. Therefore, there is a need for a digital system (and a method for operating the same) in which the multiple asynchronous logic domains can be tested in any desired order.

SUMMARY OF THE INVENTION

The present invention provides a digital system, comprising (a) a first pin and a second pin; (b) a first logic domain and a second logic domain; and (c) a first test pulse generator circuit and a second test pulse generator circuit, wherein the first test pulse generator circuit is electrically coupled to the first pin and the first logic domain, wherein the second test pulse generator circuit is electrically coupled to the second pin and the second logic domain, wherein in response to a first test signal being asserted and K common test enable signals being asserted, K being a positive integer, the first test pulse generator circuit is capable of generating two first test pulses to the first logic domain resulting in the first logic domain being tested, and wherein in response to a second test signal being asserted and the K common test enable signals being asserted, the second test pulse generator circuit is capable of generating two second test pulses to the second logic domain resulting in the second logic domain being tested.

The present invention also provides a digital system operation method, comprising providing a digital system which includes (a) a first pin and a second pin, (b) a first logic domain and a second logic domain, and (c) a first test pulse generator circuit and a second test pulse generator circuit, wherein the first test pulse generator circuit is electrically coupled to the first pin and the first logic domain, wherein the second test pulse generator circuit is electrically coupled to the second pin and the second logic domain; in response to a first test signal being asserted and K common test enable signals being asserted, K being a positive integer, using the first test pulse generator circuit to generate two first test pulses to the first logic domain resulting in the first logic domain being tested; and in response to a second test signal being asserted and the K common test enable signals being asserted, using the second test pulse generator circuit to generate two second test pulses to the second logic domain resulting in the second logic domain being tested.

The present invention provides a novel digital system (and a method for operating the same) in which the multiple asynchronous logic domains of the digital system can be tested in any desired order.

DETAILED DESCRIPTION OF THE INVENTION

Figure 1:
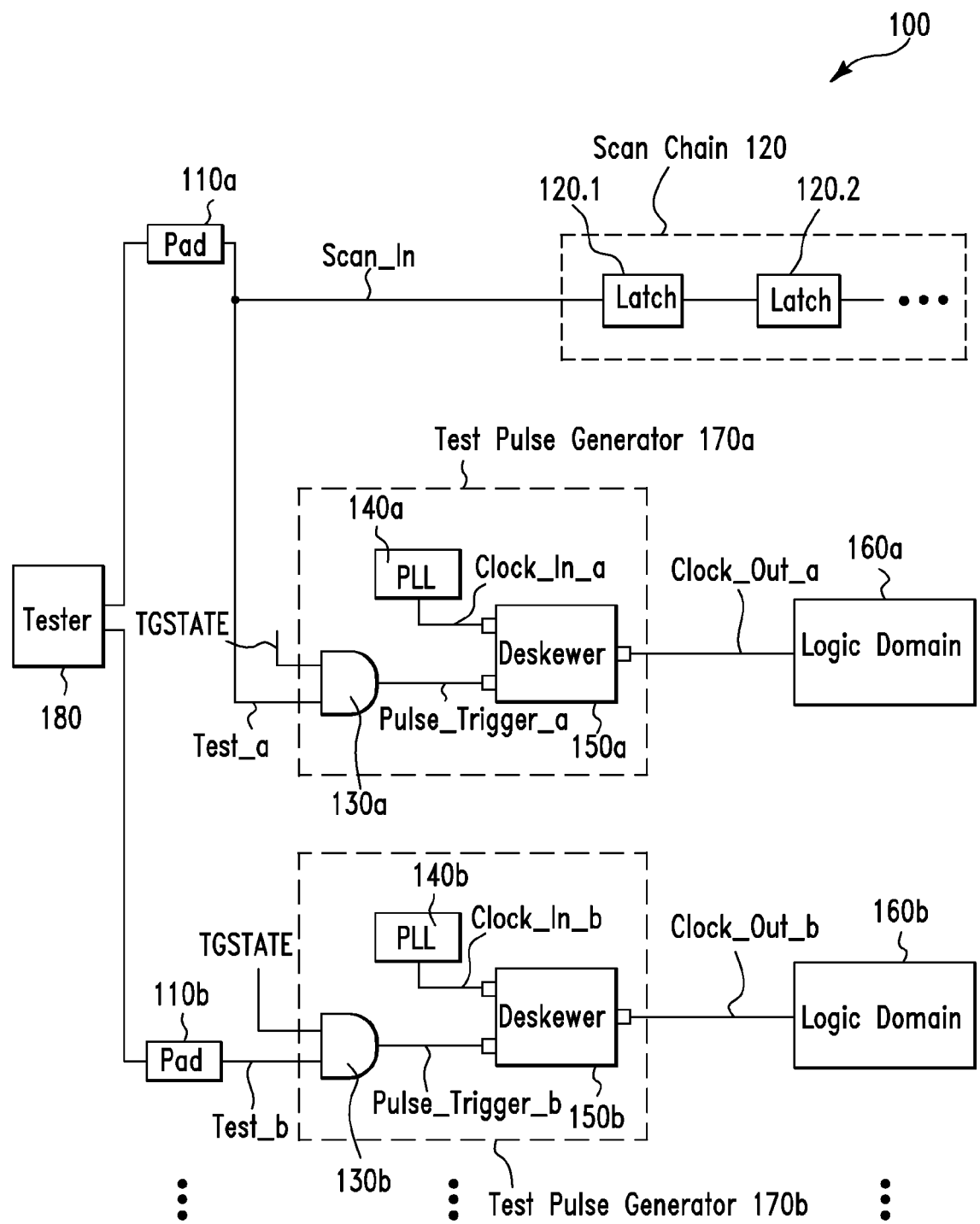
FIG. 1 shows a digital system, in accordance with embodiments of the present invention.

FIG. 1 shows a digital system 100, in accordance with embodiments of the present invention. More specifically, in one embodiment, the digital system 100 comprises N pads (N is a positive integer) such as pads 110*a* and 110*b*. For simplicity, only the two pads 110*a* and 110*b* of the N pads are shown in FIG. 1. In one embodiment, the digital system 100 further comprises a scan chain 120 which includes multiple latches electrically coupled together in a chain. For simplicity, only two latches 120.1 and 120.2 of the scan chain 120 are shown in FIG. 1. Illustratively, the latch 120.1 receives a signal Scan_In from a tester 180 via the pad 110*a*. In one embodiment, the digital system 100 further comprises N logic domains, only two of which (logic domains 160*a* and 160*b*) are shown in FIG. 1 for simplicity. In one embodiment, each of the N logic domains is a digital circuit operating according to an independent clock signal. It should be noted that although shown separately, the scan chain 120 is essentially a part of the N logic domains of the digital system 100.

In one embodiment, the digital system 100 further comprises N deskewers (e.g., deskewers 150*a* and 150*b*) electrically coupled one-to-one to the N logic domains. For simplicity, only the two deskewers 150*a* and 150*b* of the N deskewers are shown in FIG. 1. In one embodiment, the deskewer 150*a* generates a signal Clock_Out_a to the logic domain 160*a*. Similarly, the deskewer 150*b* generates a signal Clock_Out_b to the logic domain 160*b*, and so on for the other deskewers of the N deskewers.

In one embodiment, the digital system 100 further comprises N PLL (phase lock loop) circuits (e.g., PLL circuits 140*a* and 140*b*) electrically coupled one-to-one to the N deskewers. More specifically, the PLL circuit 140*a* generates a clock signal (called signal Clock_In_a) to the deskewer 150*a*. Similarly, PLL circuit 140*b* generates a clock signal (called signal Clock_In_b) to the deskewer 150*b*, and so on the for the other PLL circuits of the N PLL circuits. In one embodiment, each of the N clock signals generated by the N PLL circuits has a unique frequency.

In one embodiment, the digital system 100 further comprises N AND gates (e.g., AND gates 130*a* and 130*b*) electrically coupled one-to-one to the N deskewers. More specifically, the AND gate 130*a* receives a signal Test_a from the tester 180 via the pad 110*a* and generates a signal Pulse_Trigger_a to the deskewer 150*a*. Similarly, the AND gate 130*b* receives signal Test_b from the pad 110*a* and generates signal Pulse_Trigger_b to the deskewer 150*b*, and so on for the other AND gates of the N AND gates. In one embodiment, the N AND gates also receive a test enable signal TGSTATE from the tester 180. It should be noted that the deskewer 150*a*, the PLL circuit 140*a*, and the AND gate 130*a* can be collectively referred to as a test pulse generator circuit 170*a*. Similarly, the deskewer 150*b*, the PLL circuit 140*b*, and the AND gate 130*b* can be collectively referred to as a test pulse generator circuit 170*b* and so on for the other deskewers, PLL circuits, and AND gates.

In one embodiment, the deskewer 150*a* is capable of generating two test pulses on signal Clock_Out_a in response to the signal Pulse_Trigger_a going from low to high level. Similarly, the deskewer 150*b* is capable of generating two test pulses on signal Clock_Out_b in response to the signal Pulse_Trigger_b going from low to high level, and so on for the other deskewers of the N deskewers.

In one embodiment, the digital system 100 is a chip 100 (an integrated circuit) and the N pads are N pins of P pins of the chip 100 (P is a positive integer and P≧N). In one embodiment, the N pads can also be shared by other circuits of the N logic domains. For instance, the pad 110a can also be used for scanning test patterns into the scan chain 120 (which is a part of the N logic domains), whereas the pad 110b can also be used as an input node for a circuit (not shown) in the N logic domains.

In one embodiment, with reference to FIG. 1, the testing operation of the digital system 100 is as follows. More specifically, in one embodiment, the testing operation of the digital system 100 starts with the tester 180 scanning in a first test pattern into the scan chain 120 via the pad 110a. In one embodiment, while scanning in the first test pattern into the scan chain 120, the tester 180 holds the test enable signal TGSTATE at low level causing the deskewer 150a to hold the signal Clock_Out_a at low level. Similarly, the other deskewers of the N deskewers hold their associated outputs at low level.

Next, in one embodiment, after scanning in the first test pattern into the scan chain 120, the tester 180 pulls the N signals Test_a, Test_b, . . . to low level via the N pads 110a, 110b, . . . , respectively. Next, in one embodiment, the tester 180 pulls the test enable signal TGSTATE to high level. Assume that the tester 180 is to test the logic domain 160b first. As a result, the tester 180 pulls signal Test_b to high level and holds the other N−1 test signals (Test_a, Test_c, Test_d, . . . ) at low level. In response, the signal Pulse_Trigger_b changes from low level to high level, causing the deskewer 150b to generate two test pulses on the signal Clock_Out_b to the logic domain 160b. The first pulse of the two test pulses causes the launch of the test value of the first test pattern from the scan chain 120 into inputs of different circuits (not shown) of the logic domain 160b. Later, the second pulse of the two test pulses causes the capture of the test result (outputs of the circuits of the logic domain 160b) into the same scan chain 120. Next, in one embodiment, the tester 180 pulls the signal Test_b to low level.

Next, in one embodiment, the tester 180 can test any of the N logic domains in a manner similar to the manner in which the tester 180 tests the logic domain 160b. In other words, the tester 180 can test in turn the N logic domains in any order. After that, in one embodiment, the tester 180 pulls test enable signal TGSTATE to low level and scans out the test result from the scan chain 120. After that, in one embodiment, another round of testing can be performed in which the tester 180 can scan in a second test pattern into the scan chain 120 and perform the testing on the N logic domains in a manner similar to the manner of the first round.

In the embodiment described above, in the first round of the testing of the N logic domains, the tester 180 tests the logic domain 160b first. Alternatively, in the first round of the testing of the N logic domains, the tester 180 can first test both the logic domains 160a and 160b simultaneously. As a result, after scanning in the first test pattern into the scan chain 120, the tester 180 pulls signals Test_a and Test_b to high level simultaneously and holds the other N−2 test signals (Test_c, Test_d . . . ) at low level. In response, the signals Pulse_Trigger_a and Pulse_Trigger_b change from low level to high level. In response to the signal Pulse_Trigger_a changing from low level to high level, the deskewer 150a generates two test pulses on the signal Clock_Out_a to the logic domain 160a resulting in the logic domains 160a being tested. Simultaneously, in response to the signal Pulse_Trigger_b changing from low level to high level, the deskewer 150b generates two test pulses on the signal Clock_Out_b to the logic domain 160b resulting in the logic domains 160a being tested. After that, the tester 180 pulls signals Test_a and Test_b to low level. In one embodiment, in a similar manner, the tester 180 can test one, two, or more logic domains at a time and in any order. After that, in one embodiment, the tester 180 pulls test enable signal TGSTATE to low level and scans out the test result from the scan chain 120.

Figure 2:
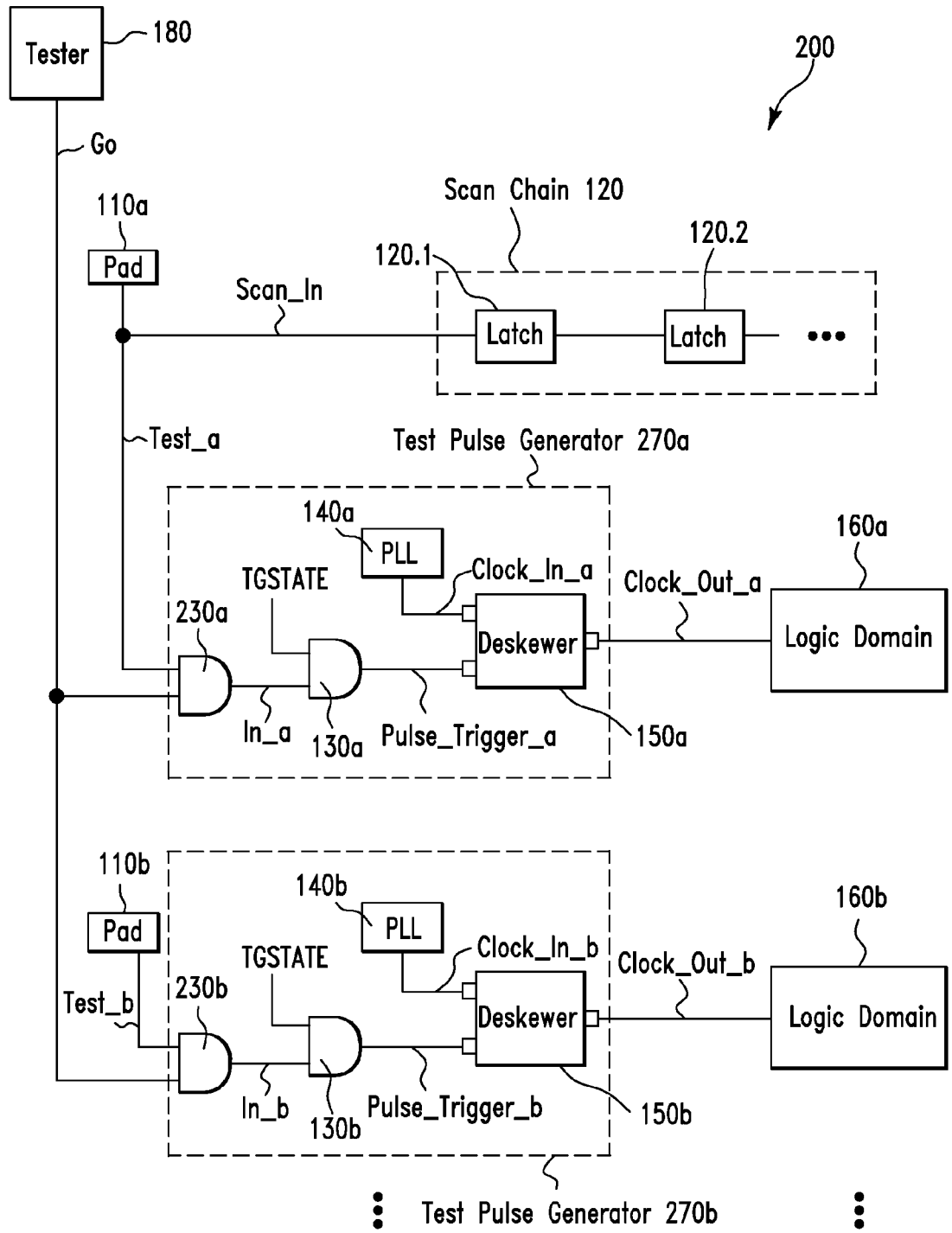
FIG. 2 shows another digital system, in accordance with embodiments of the present invention.

FIG. 2 shows a digital system 200, in accordance with embodiments of the present invention. More specifically, in one embodiment, the structure of the digital system 200 is similar to the structure of the digital system 100 except that each of the N test pulse generator circuits further comprises an extra AND gate. More specifically, the test pulse generator circuit 270a further comprises an AND gate 230a coupled between the pad 110a and the AND gate 130a as shown in FIG. 2. Similarly, the test pulse generator circuit 270b further comprises an AND gate 230b coupled between the pad 110b and the AND gate 130b as shown in FIG. 2, and so on for the other N−2 test pulse generator circuits. In one embodiment, the N extra AND gates 230a, 230b . . . also receive a signal Go from the tester 180.

In one embodiment, with reference to FIG. 2, the testing operation of the digital system 200 is as follows. More specifically, in one embodiment, the testing operation of the digital system 200 starts with the tester 180 scanning in a third test pattern into the scan chain 120. In one embodiment, while scanning in the third test pattern into the scan chain 120, the tester 180 holds the test enable signal TGSTATE and the signal Go at low level.

In one embodiment, after scanning in the third test pattern into the scan chain 120, the tester 180 pulls the N signals Test_a, Test_b . . . to low level via the N pads 110a, 110b, . . . , respectively. Next, in one embodiment, the tester 180 pulls the test enable signal TGSTATE to high level and still holds the signal Go at low level.

Assume that the tester 180 is to test the logic domain 160b first. As a result, after pulling the test enable signal TGSTATE to high level, the tester 180 pulls signal Test_b to high level and holds the other N−1 test signals (Test_a, Test_c, Test_d, . . . ) at low level. Next, in one embodiment, the tester 180 pulls the signal Go to high level. In response, the signal In_b changes from low level to high level. As a result, the signal Pulse_Trigger_b changes from low level to high level, causing the deskewer 150b to generate two test pulses on the signal Clock_Out_b to the logic domain 160b resulting in the logic domain 160b being tested. After that, in one embodiment, the tester 180 pulls both the signal Test_b and the signal Go to low level.

Next, in one embodiment, the tester 180 can test any of the N logic domains in a manner similar to the manner in which the tester 180 tests the logic domain 160b. In other words, the tester 180 can test in turn the N logic domains in any order. After that, in one embodiment, the tester 180 pulls test enable signal TGSTATE to low level and scans out the test result from the scan chain 120. After that, in one embodiment, another round of testing can be performed in which the tester 180 can scan in a fourth test pattern into the scan chain 120 and perform the testing on the N logic domains in a manner similar to the manner of the first round. It should be noted that for each round of testing, the tester 180 can test one, two, or more logic domains at a time and in any order. After that, in one embodiment, the tester 180 pulls test enable signal TGSTATE to low level and scans out the test result from the scan chain 120.

Figure 3:
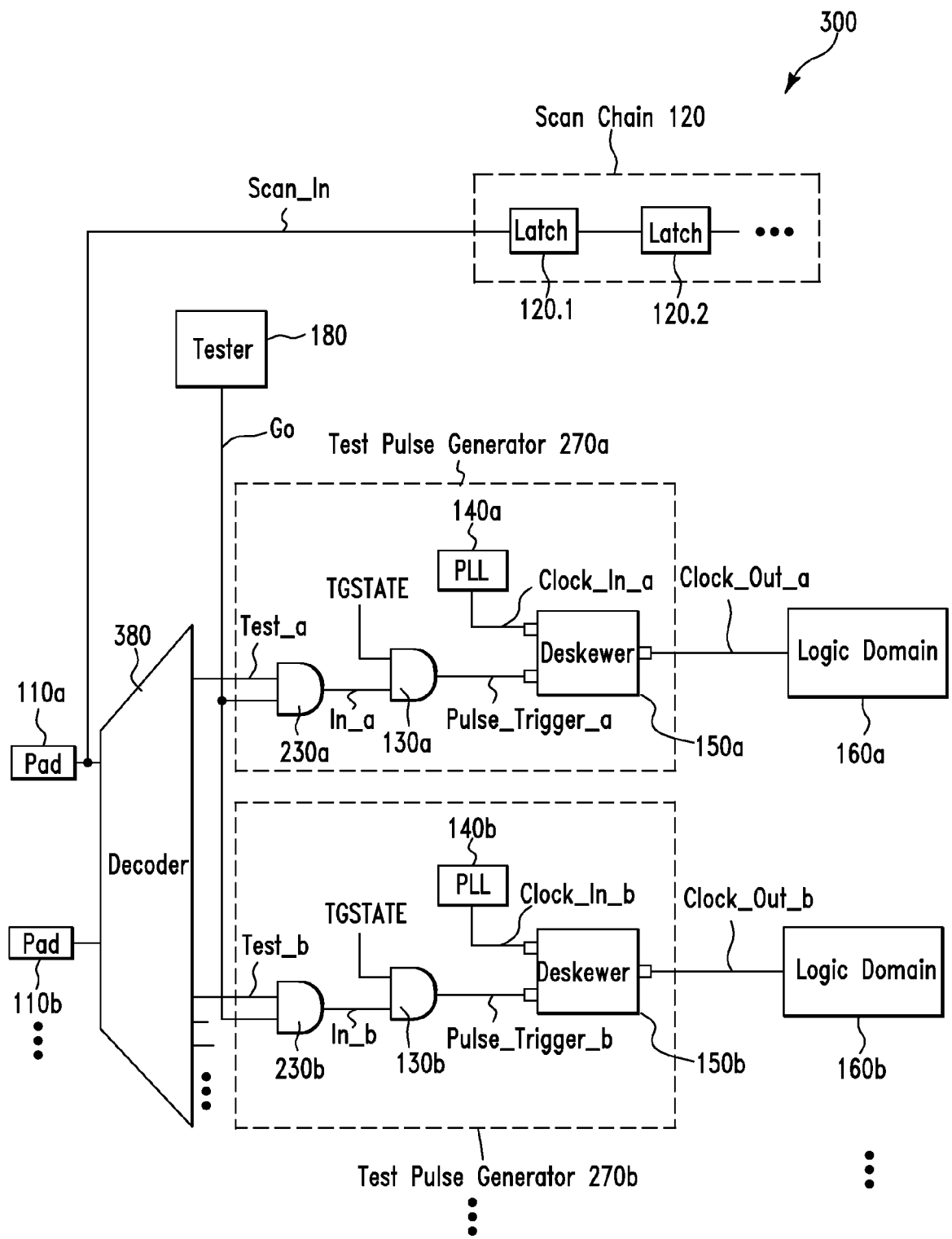
FIG. 3 shows yet another digital system, in accordance with embodiments of the present invention.

FIG. 3 shows a digital system 300, in accordance with embodiments of the present invention. More specifically, in one embodiment, the structure of the digital system 300 is similar to the structure of the digital system 200 except that the N AND gates 230a, 230b ... of the N test pulse generator circuits 270a, 270b ..., respectively, are electrically coupled to M pads (M is a positive integer smaller than N) via a decoder 380. In one embodiment, $2^m$=N. For example, M is 3 and N is 8.

In one embodiment, the testing operation of the digital system 300 of FIG. 3 is similar to the testing operation of the digital system 200 of FIG. 2, except that the tester 180, via the M pads 110a, 110b, ... and the decoder 380, tests one of the N logic domain at a time. This means that only one logic domain of the N logic domains can be tested at a time. However, the number of pins used by tester 180 to test the N logic domains is reduced in comparison with the embodiments of FIGS. 1 and 2. More specifically, with reference to FIGS. 1 and 2, N pins are used by the tester 180 to test the N logic domains. In FIG. 3, the tester 180 uses only M pins of the digital system 300 to test the N logic domains wherein $2^M \geq N \geq 2^{M-1}$.

In the embodiments above, with reference to FIGS. 1-3, each PLL circuit feeds one deskewer. In general, one PLL circuit can feed one or more deskewer.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A digital system, comprising:
   (a) a first pin and a second pin;
   (b) a first logic domain and a second logic domain; and
   (c) a first test pulse generator circuit and a second test pulse generator circuit,
      wherein the first test pulse generator circuit is electrically coupled to the first pin and the first logic domain,
      wherein the second test pulse generator circuit is electrically coupled to the second pin and the second logic domain,
      wherein in response to a first test signal being asserted and K common test enable signals being asserted, K being a positive integer, the first test pulse generator circuit is capable of generating two first test pulses to the first logic domain resulting in the first logic domain being tested, and
      wherein in response to a second test signal being asserted and the K common test enable signals being asserted, the second test pulse generator circuit is capable of generating two second test pulses to the second logic domain resulting in the second logic domain being tested.

2. The digital system of claim 1,
   where in K=1, and
   wherein, with K being equal to 1, the K common test enable signals can be referred to as the common test enable signal.

3. The digital system of claim 2, further comprising a tester electrically coupled to the first and second pins,
   wherein the tester is capable of generating the first and second test signals via the first and second pins, respectively, and
   wherein the tester is further capable of generating the common test enable signal to the first and second test pulse generator circuits via a third pin of the digital system.

4. The digital system of claim 3,
   wherein the first test pulse generator circuit comprises a first deskewer and a first PLL circuit electrically coupled to the first deskewer,
   wherein the first PLL circuit is capable of generating a first clock signal to the first deskewer, and
   wherein the first deskewer is capable of generating the two first clock pulses to the first logic domain in response to
      (i) the first test signal being asserted via the first pin, and
      (ii) the common test enable signal being asserted via the third pin.

5. The digital system of claim 4,
   wherein the second test pulse generator circuit comprises a second deskewer and a second PLL circuit electrically coupled to the second deskewer,
   wherein the second PLL circuit is capable of generating a second clock signal to the second deskewer, and
   wherein the second deskewer is capable of generating the two second clock pulses to the second logic domain in response to
      (i) the second test signal being asserted via the second pin, and
      (ii) the common test enable signal being asserted via the third pin.

6. The digital system of claim 4,
   wherein the first test pulse generator circuit further comprises an AND gate electrically coupled to the first deskewer and the first pin, and
   wherein the AND gate is capable of asserting a pulse trigger signal to the first deskewer in response to
      (i) the first test signal being asserted via the first pin, and
      (ii) the common test enable signal being asserted via the third pin.

7. The digital system of claim 3, further comprising a scan chain electrically coupled to the first pin,
   wherein the scan chain is capable of receiving test patterns via the first pin.

8. The digital system of claim 7,
   wherein the first test pulse generator circuit comprises a first deskewer and a first PLL circuit electrically coupled to the first deskewer,
   wherein the first PLL circuit is capable of generating a first clock signal to the first deskewer, and
   wherein the first deskewer is capable of generating the two first clock pulses to the first logic domain in response to
      (i) the first test signal being asserted via the first pin, and
      (ii) the common test enable signal being asserted via the third pin.

9. The digital system of claim 2, further comprising a scan chain electrically coupled to the first pin,
   wherein the scan chain is capable of receiving test patterns via the first pin.

10. The digital system of claim 2, further comprising a decoder electrically coupled to the first pin, the second pin, and the first and second test pulse generator circuits,
    wherein the decoder is capable of receiving input signals from the first and second pins, and
    wherein the decoder is capable of generating the first and second test signals to the first and second test pulse generator circuits, respectively.

11. The digital system of claim 1,
    wherein K=2, and
    wherein, with K being equal to 2, the K common test enable signals can be referred to as the common test enable signal and a Go signal.

12. A digital system operation method, comprising:

providing a digital system which includes (a) a first pin and a second pin, (b) a first logic domain and a second logic domain, and (c) a first test pulse generator circuit and a second test pulse generator circuit, wherein the first test pulse generator circuit is electrically coupled to the first pin and the first logic domain, wherein the second test pulse generator circuit is electrically coupled to the second pin and the second logic domain;

in response to a first test signal being asserted and K common test enable signals being asserted, K being a positive integer, using the first test pulse generator circuit to generate two first test pulses to the first logic domain resulting in the first logic domain being tested; and in response to a second test signal being asserted and the K common test enable signals being asserted, using the second test pulse generator circuit to generate two second test pulses to the second logic domain resulting in the second logic domain being tested.

13. The method of claim 12, wherein K=1, and wherein, with K being equal to 1, the K common test enable signals can be referred to as the common test enable signal.

14. The method of claim 13, further comprising:

using a tester to generate the first and second test signals via the first and second pins, respectively; and using the tester to further generate the common test enable signal to the first and second test pulse generator circuits via a third pin of the digital system, wherein the tester is electrically coupled to the first and second pins.

15. The method of claim 14, further comprising:

using a first deskewer to generate the two first clock pulses to the first logic domain in response to (i) the first test signal being asserted via the first pin, and (ii) the common test enable signal being asserted via the third pin; and using a first PLL circuit to generate a first clock signal to the first deskewer, wherein the first test pulse generator circuit includes the first deskewer and the first PLL circuit electrically coupled to the first deskewer.

16. The method of claim 15, further comprising:

using a second deskewer to generate the two second clock pulses to the second logic domain in response to (i) the second test signal being asserted via the second pin, and (ii) the common test enable signal being asserted via the third pin; and using a second PLL circuit to generate a second clock signal to the second deskewer, wherein the second test pulse generator circuit includes the second deskewer and the second PLL circuit electrically coupled to the second deskewer.

17. The method of claim 15, further comprising using an AND gate to assert a pulse trigger signal to the first deskewer in response to (i) the first test signal being asserted via the first pin, and (ii) the common test enable signal being asserted via the third pin, wherein the first test pulse generator circuit further includes the AND gate electrically coupled to the first deskewer and the first pin.

18. The method of claim 13, further comprising using a scan chain to receive test patterns via the first pin, wherein the digital system further includes the scan chain electrically coupled to the first pin.

19. The digital system of claim 13, further comprising:

using a decoder to receive input signals from the first and second pins; and using the decoder to generate the first and second test signals to the first and second test pulse generator circuits, respectively, wherein the digital system further includes the decoder electrically coupled to the first pin, the second pin, and the first and second test pulse generator circuits.

20. The method of claim 12, wherein K=2, and wherein, with K being equal to 2, the K common test enable signals can be referred to as the common test enable signal and a Go signal.

* * * * *